(12) United States Patent
Shin

(10) Patent No.: US 8,318,592 B2
(45) Date of Patent: Nov. 27, 2012

(54) GATE PATTERNS OF NONVOLATILE MEMORY DEVICE AND METHOD OF FORMING THE SAME

(75) Inventor: Wan Sup Shin, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 265 days.

(21) Appl. No.: 12/648,074

(22) Filed: Dec. 28, 2009

(65) Prior Publication Data

US 2010/0308396 A1    Dec. 9, 2010

(30) Foreign Application Priority Data

Jun. 8, 2009    (KR) ........................ 10-2009-0050448

(51) Int. Cl.
H01L 21/3205    (2006.01)

(52) U.S. Cl. ....................................... 438/594; 257/321

(58) Field of Classification Search ................... 257/321; 438/594
See application file for complete search history.

(56) References Cited

U.S. PATENT DOCUMENTS

| 6,924,536 B2 * | 8/2005 | Nishiyama et al. | 257/411 |
| 2008/0227268 A1 * | 9/2008 | Lee | 438/425 |
| 2008/0286919 A1 * | 11/2008 | Goda | 438/211 |

FOREIGN PATENT DOCUMENTS

| JP | 2004-186185 A | 7/2004 |
| KR | 10-2005-0073377 | 7/2005 |
| KR | 10-2008-0022947 | 3/2008 |

* cited by examiner

Primary Examiner — Shaun Campbell
(74) Attorney, Agent, or Firm — Marshall, Gerstein & Borun LLP

(57) ABSTRACT

A method of forming gate patterns of a nonvolatile memory device comprises forming stack patterns each having an insulating layer and a conductive layer stacked over a semiconductor substrate, and forming an anti-oxidation layer on sidewalls of the insulating layer by selectively nitrifying the insulating layer.

19 Claims, 5 Drawing Sheets

GATE PATTERNS OF NONVOLATILE MEMORY DEVICE AND METHOD OF FORMING THE SAME

CROSS-REFERENCE TO RELATED APPLICATION

Priority to Korean patent application number 10-2009-0050448 filed on Jun. 8, 2009, the entire disclosure of which is incorporated by reference herein, is claimed.

BACKGROUND

An embodiment relates generally to a nonvolatile memory device and, more particularly, to the gate patterns of a nonvolatile memory device and a method of forming the same.

Active research is being carried out on nonvolatile memory devices, particularly NAND flash memory devices that can be easily highly integrated. A memory cell of the NAND flash memory device includes a gate in which a floating gate, a dielectric layer, and a control gate are stacked. The stacked gate is formed over a semiconductor substrate with a tunnel insulating layer interposed therebetween. In such a NAND flash memory device, program and erase operations are performed by controlling the threshold voltage of the memory cell in such a way as to inject or discharge electrons into or from the floating gate using the Fowler-Nordheim tunneling method.

Voltage (Vf) induced in the floating gate is determined by the coupling ratio and voltage (Vc) applied to the control gate as shown in Equation below. The coupling ratio is a ratio of capacitance (Cip) of the dielectric layer to the sum of capacitance (Ctn) of the tunnel insulating layer and the capacitance (Cip) of the dielectric layer.

$$Vf = \frac{Cip}{Cip + Ctn} Vc$$

Thus, if the equivalent oxide thickness (EOT) (i.e., the thickness of the tunnel insulating layer or the dielectric layer) is uniform, the threshold voltages of memory cells can be uniformly controlled. In a process of forming the memory cell gate, the thickness of the tunnel insulating layer or the dielectric layer of the memory cell may vary.

The memory cell gate of a conventional NAND flash memory device is described below in more detail with reference to FIGS. 1 and 2.

Referring to FIG. 1, the memory cell gate of the NAND flash memory device includes a first conductive layer 5 for a floating gate, a dielectric layer 11, and a second conductive layer 13 for a control gate stacked over a tunnel insulating layer 3.

In order to form the memory cell gate, the tunnel insulating layer 3 and the first conductive layer 5 are first stacked over a semiconductor substrate 1. The first conductive layer 5 and the tunnel insulating layer 3 formed over isolation regions B are removed, and the isolation regions B of the semiconductor substrate 1 are etched to form trenches. Through formation of the trenches, active regions A of the semiconductor substrate 1 are defined, and the tunnel insulating layer 3 and the first conductive layer 5 remain over the active regions A.

Next, in order to remove defects generated on surfaces of the trenches and the first conductive layer 5, an oxidation process is performed to form a sidewall oxide layer 7. Referring to FIG. 2, the oxidation process for removing defects generated on the surfaces of the trenches and the first conductive layer 5 is performed using $H_2O$ or $O_2$. Here, $H_2O$ or $O_2$ molecules are diffused from the side of the tunnel insulating layer 3 to the interface of the tunnel insulating layer 3 and the semiconductor substrate 1, thus oxidizing an upper edge X1 of the active region of the semiconductor substrate 1. Furthermore, the $H_2O$ or $O_2$ molecules are diffused from the side of the tunnel insulating layer 3 to the interface of the tunnel insulating layer 3 and the first conductive layer 5, thus oxidizing a lower edge X2 of the first conductive layer 5. Consequently, the thickness of the edges of the tunnel insulating layer 3 is increased.

After the sidewall oxide layer 7 is formed, an isolation layer 9 comprising insulating material is formed within each of the trenches. In order to densify the film of the insulating material constituting the isolation layer 9, a thermal process, such as annealing, can be performed. The thermal process can increase the thickness of the edges of the tunnel insulating layer 3.

Next, the dielectric layer 11 and the second conductive layer 13 are deposited over the semiconductor substrate 1, and the second conductive layer 13, the dielectric layer 11, and the first conductive layer 5 are patterned. In order to remove defects generated on surfaces of the first and second conductive layers 5 and 13, another oxidation process can be performed. The oxidation process may increase the thickness of the edges of the dielectric layer 11.

As described above, a change in the thickness of the tunnel insulating layer 3 or the dielectric layer 11 may be caused, which may change the coupling ratio between the memory cells, resulting in poor distribution of the threshold voltages of the memory cells.

BRIEF SUMMARY

An embodiment relates to gate patterns of a nonvolatile memory device and a method of forming the same, which are capable of preventing the edges of an insulating layer from thickening even though an oxidation process for removing defects generated on the sidewalls of a memory cell gate is performed.

In an aspect of this disclosure, a method of forming gate patterns of a nonvolatile memory device comprises forming stack patterns each having an insulating layer that defines sidewalls and a conductive layer stacked over a semiconductor substrate, and forming an anti-oxidation layer on the sidewalls of the insulating layer by selectively nitrifying the insulating layer.

Forming the anti-oxidation layer preferably comprises using a mixed gas of (a) a source gas comprising nitrogen-bonded molecules, (b) an inert gas that forms a plasma, and (c) an etch gas that selectively breaks bonds of molecules constituting the insulating layer.

The insulating layer preferably comprises silicon dioxide ($SiO_2$) having Si—O bonds, and the conductive layer preferably comprises polysilicon. The etch gas preferably comprises at least one of $C_xF_y$ and $CH_xF_y$.

The anti-oxidation layer preferably is formed by breaking Si—O bonds of the insulating layer comprising silicon dioxide ($SiO_2$) and bonding a nitrogen radical (N*) to Si separated from the Si—O bonds.

The method preferably further comprises oxidizing a surface of the conductive layer after forming the anti-oxidation layer.

In another aspect of this disclosure, a method of forming gate patterns of a nonvolatile memory device comprises providing a semiconductor substrate comprising isolation regions and active regions, forming trenches in the respective isolation regions and forming stack patterns each having a tunnel insulating layer that defines sidewalls and a first conductive layer stacked over each of the active regions, and forming a first anti-oxidation layer on sidewalls of the tunnel insulating layer by selectively nitrifying the tunnel insulating layer.

Forming the first anti-oxidation layer preferably comprises using a mixed gas of (a) a source gas comprising nitrogen-bonded molecules, (b) an inert gas that forms a plasma, and (c) an etch gas that selectively breaks bonds of molecules constituting the tunnel insulating layer.

The tunnel insulating layer preferably comprises silicon dioxide ($SiO_2$) having Si—O bonds, and the first conductive layer preferably comprises polysilicon. Here, the etch gas preferably comprises at least one of $C_xF_y$ and $CH_xF_y$.

The first anti-oxidation layer preferably is formed by breaking Si—O bonds of the tunnel insulating layer comprising silicon dioxide ($SiO_2$) and bonding a nitrogen radical (N*) to Si separated from the Si—O bonds.

The method preferably further comprises oxidizing surfaces of the first conductive layer and of the trenches after forming the first anti-oxidation layer.

The method preferably further comprises, after forming the first anti-oxidation layer, forming isolation layers within the respective trenches, stacking a dielectric layer and a second conductive layer over the first conductive layer and each of the isolation layers, etching the second conductive layer, the dielectric layer, and the first conductive layer, and forming a second anti-oxidation layer on the sidewalls of the dielectric layer by selectively nitrifying the dielectric layer.

Forming the second anti-oxidation layer preferably comprises using a mixed gas of (a) a source gas comprising nitrogen-bonded molecules, (b) an inert gas that forms a plasma, and (c) an etch gas that selectively breaks bonds of molecules constituting the dielectric layer.

The dielectric layer preferably comprises a stacked layer comprising silicon dioxide ($SiO_2$) having Si—O bonds, and the second conductive layer preferably comprises polysilicon. Here, the etch gas preferably comprises at least any one of $C_xF_y$ and $CH_xF_y$.

The second anti-oxidation layer preferably is formed by breaking Si—O bonds of the dielectric layer comprising silicon dioxide ($SiO_2$) and bonding a nitrogen radical (N*) to Si separated from the Si—O bonds.

The method preferably further comprises oxidizing a surface of the second conductive layer after forming the second anti-oxidation layer.

In yet another aspect of this disclosure, there are provided gate patterns of a nonvolatile memory device, each comprising a tunnel insulating layer that defines sidewalls formed on a semiconductor substrate, a first anti-oxidation layer formed on sidewalls of the tunnel insulating layer, a first conductive layer formed on the tunnel insulating layer including the first anti-oxidation layer, a dielectric layer that defines sidewalls formed on the first conductive layer, and a second conductive layer formed on the dielectric layer.

The tunnel insulating layer preferably comprises silicon dioxide ($SiO_2$) having Si—O bonds, and the first conductive layer preferably comprises polysilicon.

The gate patterns preferably further comprise a second anti-oxidation layer formed on sidewalls of the dielectric layer. The second conductive layer preferably is formed on the dielectric layer including the second anti-oxidation layer.

The dielectric layer preferably comprises a stacked layer comprising silicon dioxide ($SiO_2$) having Si—O bonds, and the second conductive layer preferably comprises polysilicon.

Each of the first anti-oxidation layer and the second anti-oxidation layer preferably comprises a nitride layer.

DESCRIPTION OF EMBODIMENT

Figure 1:
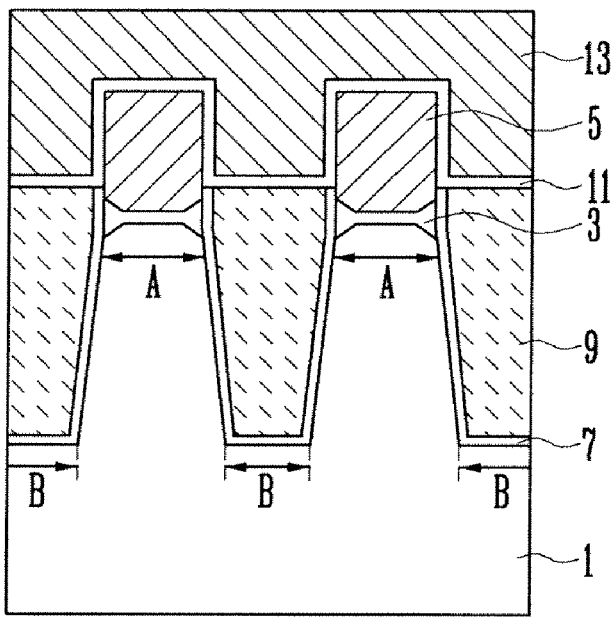
FIG. 1 is a cross-sectional view showing the gate pattern of a known nonvolatile memory device.
Figure 2:
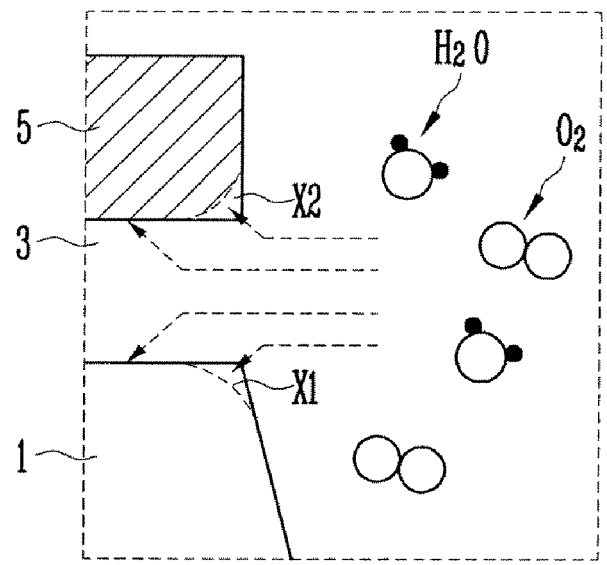
FIG. 2 is a diagram illustrating a mechanism causing an increase in the thickness of both edges of a tunnel insulating layer.

An embodiment of the present disclosure is described in detail below with reference to the accompanying drawings. The drawing figures are provided to allow those having ordinary skill in the art to understand the scope of the embodiment of the disclosure.

Figure 3:
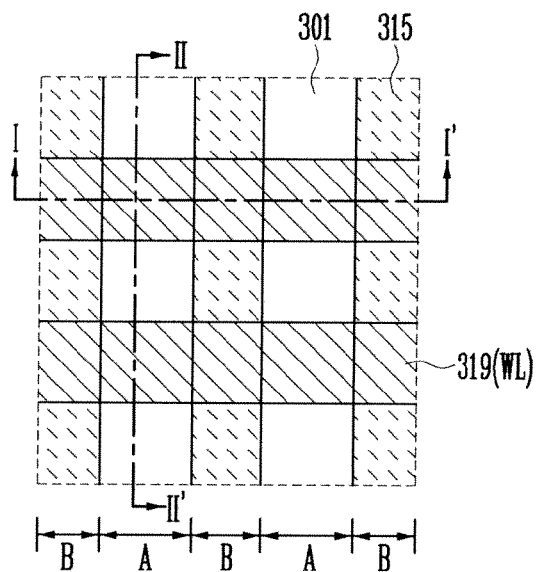
FIG. 3 is a layout diagram schematically illustrating the gate patterns of a nonvolatile memory device according to an embodiment.

FIG. 3 is a layout diagram schematically illustrating the gate patterns of a nonvolatile memory device according to an embodiment.

Referring to FIG. 3, memory cells of the nonvolatile memory device according to an embodiment are formed at respective places where word lines WL and active regions A of a semiconductor substrate 301 intersect. The memory cells are interconnected by the word lines WL intersecting the active regions A.

The active regions A are spaced apart from each other by isolation layers 315 formed in isolation regions B. The active regions A and the isolation layers 315 are alternately formed in parallel in a cell array region wherein memory cells are formed.

Each of the word lines WL is formed by interconnecting conductive layers 319 for control gates included in the memory cell gate.

The gate patterns of the nonvolatile memory device and a method of forming the same are described below in detail with reference to FIGS. 4A to 4E, which show cross-sectional views of the nonvolatile memory device taken along line I-I' and line II-II' in FIG. 3.

Figure 4A:
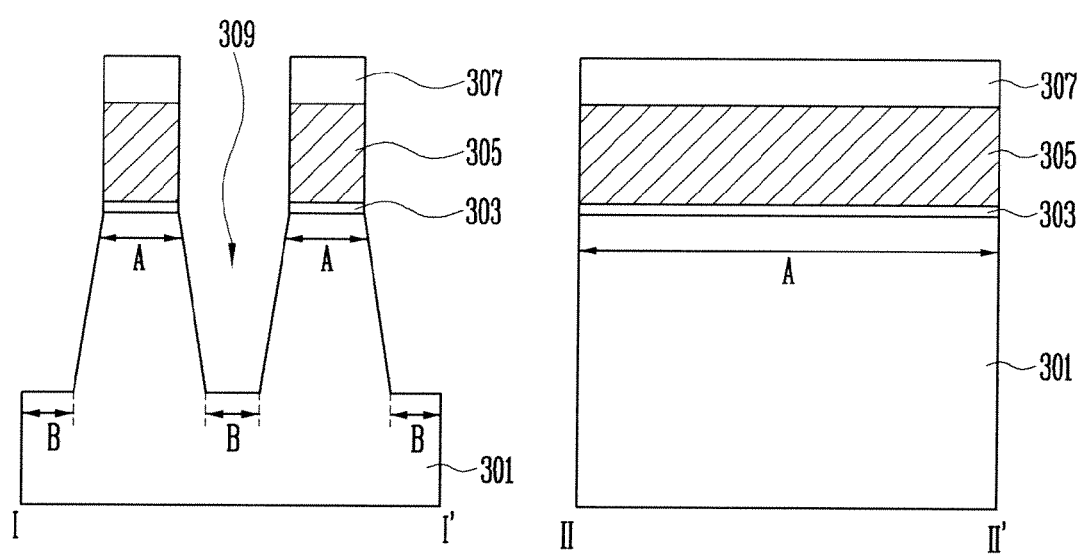
FIGS. 4A to 4E are cross-sectional views sequentially illustrating a method of forming gate patterns of the nonvolatile memory device according to an embodiment.

Referring to FIG. 4A, trenches 309 are formed in respective isolation regions B of the semiconductor substrate 301. Stack patterns in each of which a tunnel insulating layer 303 and a first conductive layer 305 are stacked are formed over the respective active regions A of the semiconductor substrate 301, which are spaced apart from each other with the trench 309 interposed therebetween.

A semiconductor substrate 301 in which a well (not shown) has been formed and on which an ion implantation process for controlling the threshold voltage has been performed can be used.

The trenches 309 are formed by etching the semiconductor substrate 301. In more detail, before forming the trenches 309, the tunnel insulating layer 303 and the first conductive layer 305 are stacked over the semiconductor substrate 301, and an isolation hard mask pattern 307 is formed on the first conductive layer 305. The isolation hard mask pattern 307 preferably is a photoresist pattern that is formed by performing exposure and development processes on a photoresist layer, or can be formed by patterning a hard mask layer through an etch process using a photoresist pattern as an etch barrier. The first conductive layer 305, the tunnel insulating layer 303, and the semiconductor substrate 301 are etched by an etch process using the isolation hard mask pattern 307 as an etch barrier. Thereby, the trenches 309 are formed in the respective isolation regions B of the semiconductor substrate 301. Furthermore, during the process of forming the trenches 309, the tunnel insulating layer 303 and the first conductive layer 305 formed over the isolation regions B are removed, and the stack patterns each comprising the tunnel insulating layer 303 and the first conductive layer 305 are formed over the respective active regions A.

The tunnel insulating layer 303 preferably comprises silicon dioxide ($SiO_2$), which includes Si—O bonds, and preferably is formed using an oxidation process or a deposition process. The first conductive layer 305 is used to form the floating gate of the flash memory device and preferably comprises a polysilicon layer.

Figure 4B:
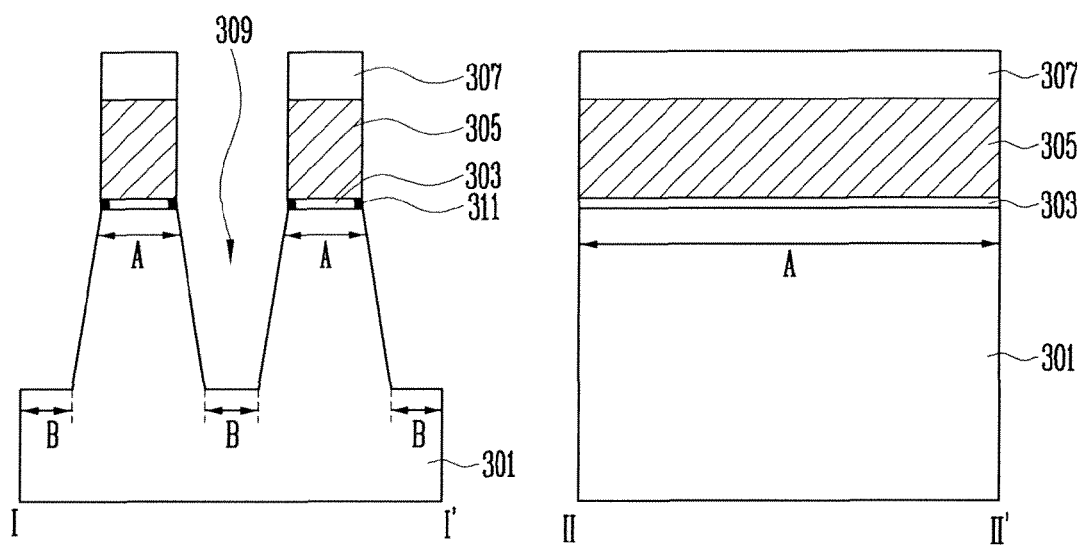

Referring to FIG. 4B, only sidewalls of the tunnel insulating layer 303 of each stack pattern are selectively nitrified to form a first anti-oxidation layer 311 on the sidewalls of the tunnel insulating layer 303.

In order to selectively nitrify only the sidewalls of the tunnel insulating layer 303, a selective plasma nitrification processing for nitrifying the tunnel insulating layer 303 more rapidly than the first conductive layer 305 and the semiconductor substrate 301 preferably is used. To this end, the process of forming the first anti-oxidation layer 311 preferably is performed using a mixed gas comprising (a) a source gas comprising nitrogen-bonded molecules, (b) an inert gas that forms a plasma, and (c) an etch gas that etches the tunnel insulating layer 303 more rapidly than the first conductive layer 305.

The source gas comprising nitrogen-bonded molecules preferably comprises at least one of $N_2$, $NH_3$, NO, and $N_2O$. The inert gas that forms a plasma preferably comprises at least one of Ar and He. In the case where the tunnel insulating layer 303 comprises silicon dioxide ($SiO_2$) having a Si—O bond and the first conductive layer 305 comprises polysilicon, the etch gas that etches the tunnel insulating layer 303 more rapidly than the etch gas etches the first conductive layer 305 preferably comprises at least one of $C_xF_y$ (highly preferably $CF_4$) and $CH_xF_y$ (highly preferably $CHF_3$).

As described above, if the etch gas having an etch selectivity for the first conductive layer 305 is added to the gas for generating a nitrogen plasma, the bonds of molecules constituting the tunnel insulating layer 303 are broken earlier than the bonds of molecules constituting the first conductive layer 305. Accordingly, defects are generated on the sidewalls of the tunnel insulating layer 303, thereby causing instability. A nitrogen radical (N*) included in the nitrogen plasma is bonded to the defect portion, and so the first anti-oxidation layer 311 (i.e., a nitride layer) is selectively formed on the sidewalls of the tunnel insulating layer 303.

When the first anti-oxidation layer 311 is selectively formed on the sidewalls of the tunnel insulating layer 303, it results in a structure in which the first conductive layer 305 is stacked on not only the tunnel insulating layer 303, but also on the first anti-oxidation layer 311.

Figure 5A:
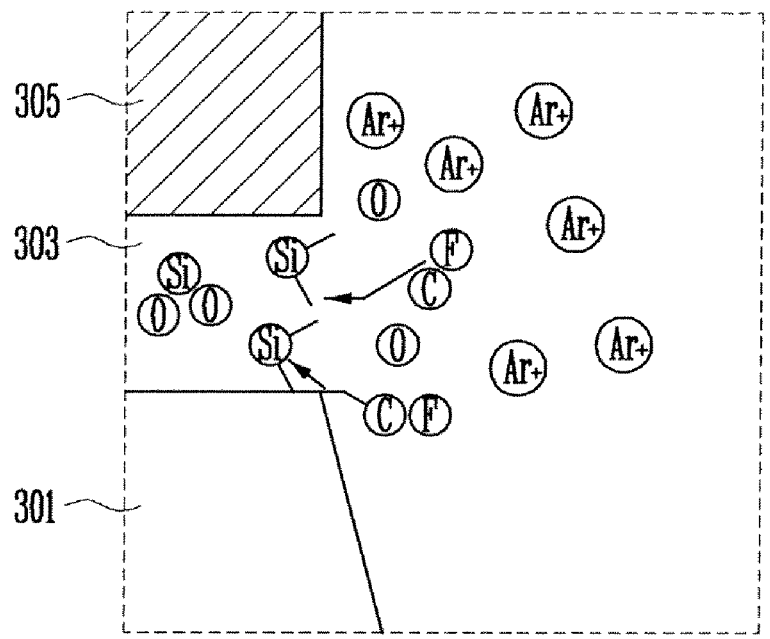
FIGS. 5A and 5B are diagrams illustrating a selective plasma nitrification process.
Figure 5B:
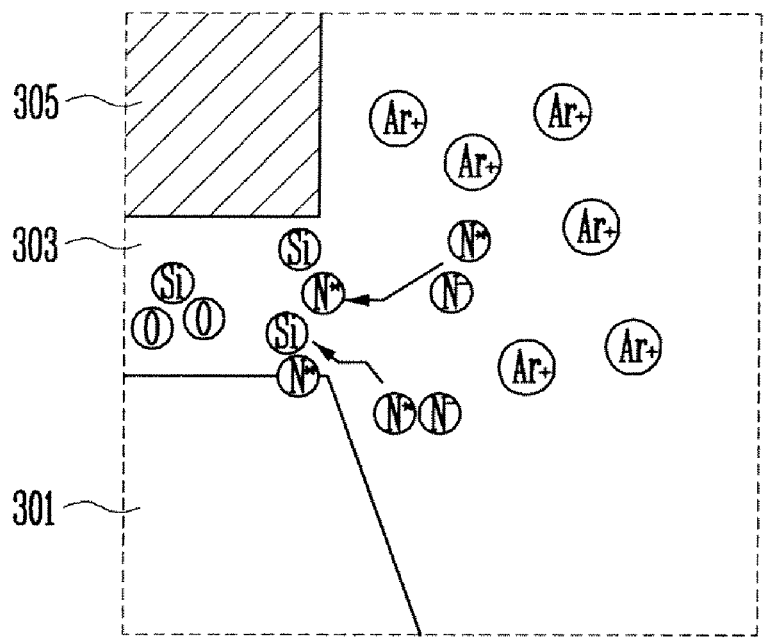

FIGS. 5A and 5B are diagrams illustrating a process of selectively nitrifying the sidewalls of a tunnel insulating layer 303 that comprises silicon dioxide.

Referring to FIG. 5A, the Si—O bonds of the tunnel insulating layer 303 comprising silicon dioxide ($SiO_2$) are broken earlier than the Si—Si bonds of the first conductive layer 305 or the semiconductor substrate 301 by an etch gas, such as $CF_4$, having an etch selectivity for the first conductive layer 305, from among the mixed gas injected into a plasma chamber. Consequently, defects are generated on the sidewalls of the tunnel insulating layer 303, resulting in instability.

Referring to FIG. 5B, the first anti-oxidation layer 311 (i.e., a silicon nitride ($Si_3N_4$) layer) is formed in the defect portion generated on the sidewalk of the tunnel insulating layer 303 (i.e., Si separated from the Si—O bonds) through a bond of the nitrogen radical (N*) included in the nitrogen plasma. The nitrogen plasma preferably is formed by the mixed gas injected into the plasma chamber, and comprises nitrogen ions (N—) and nitrogen radicals (N*).

Figure 4C:
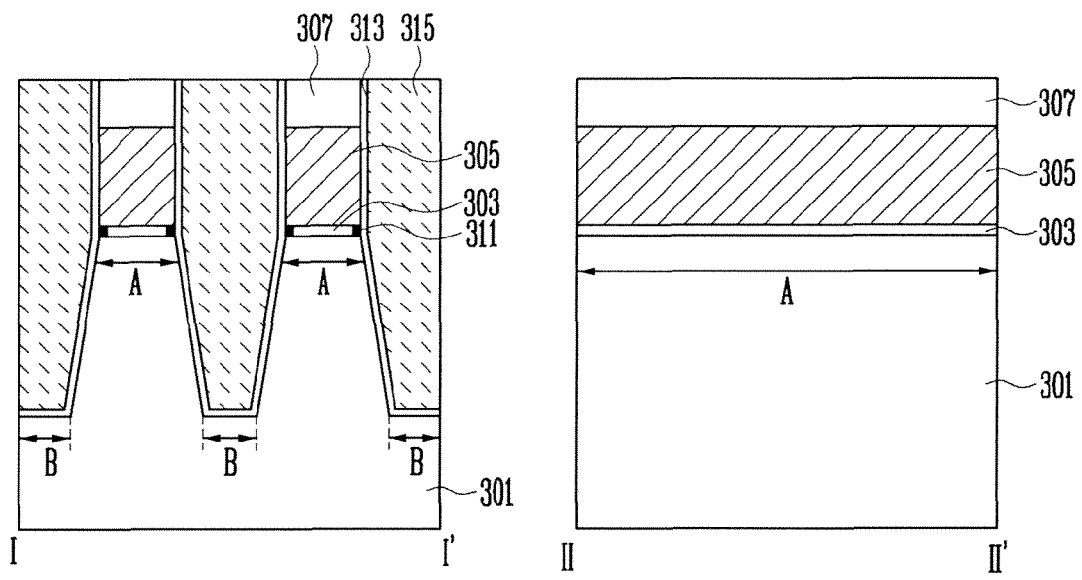

Referring to FIG. 4C, after forming the first anti-oxidation layer 311, in order to remove defects generated on the surfaces of the first conductive layers 305 and of the trenches (refer to 309 of FIG. 4B) in the process of forming the trenches, an oxidation process for oxidizing the surfaces of the trenches 309 and the first conductive layers 305 preferably is performed.

The oxidation process for oxidizing the surfaces of the trenches 309 and the first conductive layers 305 preferably comprises using at least one of $O_2$ and $H_2O$. The oxidation process causes a sidewall oxide layer 313 to be formed on the surfaces of the trenches 309, the first conductive layers 305, the first anti-oxidation layers 311, and the isolation hard mask patterns 307.

Meanwhile, although the oxidation process is performed, molecules causing oxidation, such as $O_2$ and $H_2O$, cannot infiltrate the sidewalls of the tunnel insulating layer 303 through the first anti-oxidation layer 311. Thus, a phenomenon in which the thickness of the edges of the tunnel insulating layer 303 is increased can be prevented or reduced.

After the sidewall oxide layer 313 is formed, an insulating layer having a thickness sufficient to fill the trenches 309 is deposited. A polishing process, such as chemical mechanical polishing (CMP), is performed to expose the isolation hard mask patterns 307. Thus, the isolation layers 315 are formed in the respective isolation regions B of the semiconductor substrate 301.

The isolation layers 315 preferably are formed by depositing an insulating layer using a high-density plasma (HDP) method, a spin-on dielectric (SPD) method, or a high aspect ratio process (HARP). After forming the isolation layers 315, a thermal process for making densifying the film of the insulating layer constituting the isolation layers 315, such as annealing, can be performed. Although the thermal process is performed, the first anti-oxidation layer 311 can prevent oxidized molecules from infiltrating the sidewalls of the tunnel insulating layer 303. Accordingly, a phenomenon in which the thickness of the edges of the tunnel insulating layer 303 is increased can be prevented or reduced.

Figure 4D:
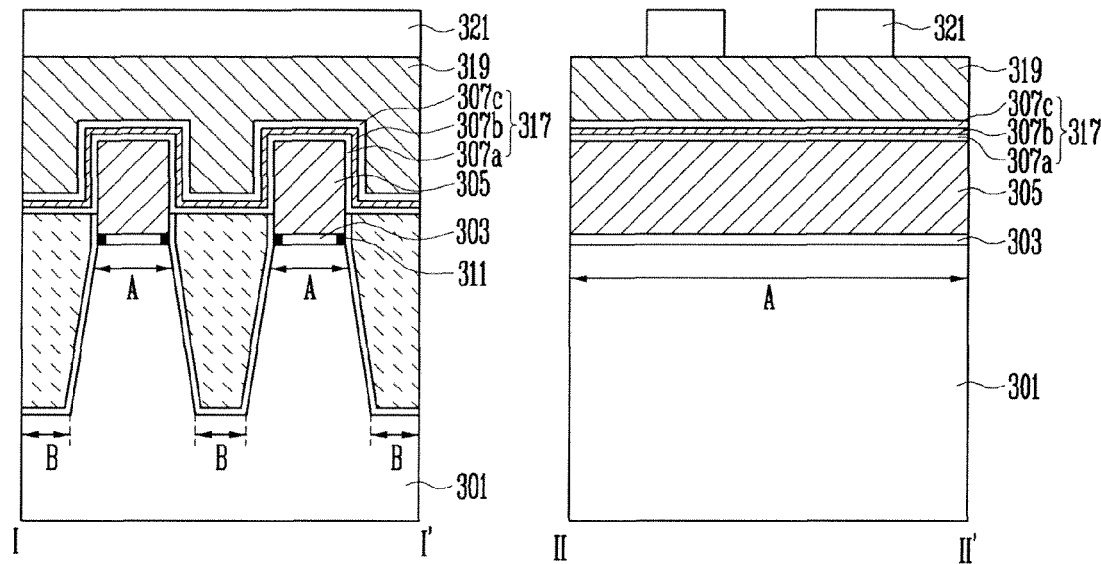

Referring to FIG. 4D, a dielectric layer 317 and a second conductive layer 319 are stacked on a surface of the isolation layers 309 and the first conductive layer 305. Gate hard mask patterns 321 are formed on the second conductive layer 319.

The dielectric layer 317 preferably has a stack structure of a first oxide layer 307a, a nitride layer 307b, and a second oxide layer 307c. Here, the first and second oxide layers 307a, 307c preferably comprise silicon dioxide ($SiO_2$) having Si—O bonds.

The second conductive layer 319 (i.e., a conductive layer for control gates) preferably comprises a polysilicon layer, or it can have a stack structure of a polysilicon layer and a metal layer.

The gate hard mask patterns 321 preferably are photoresist patterns that are formed by performing an exposure and development process on a photoresist layer or can be formed by patterning a hard mask layer through an etch process using a photoresist pattern as an etch barrier. Furthermore, the gate hard mask patterns 321 are formed in patterns which define respective regions where the word lines are formed.

Figure 4E:
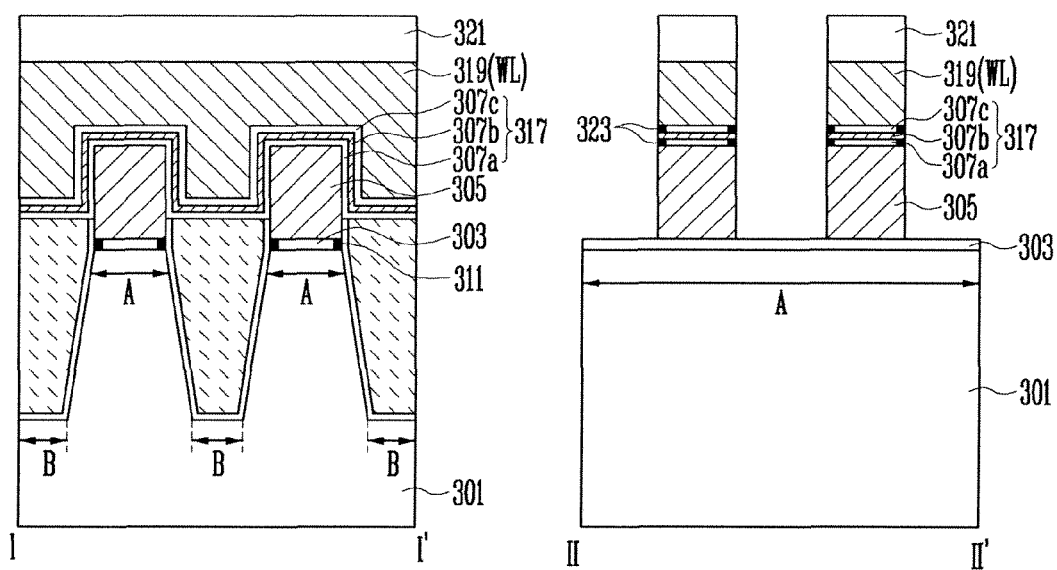

Referring to FIG. 4E, the second conductive layer 319, the dielectric layer 317, and the first conductive layers 305 are etched to expose the tunnel insulating layer 303 through an etch process using the gate hard mask patterns 321 as etch barriers. Thus, the word lines WL intersecting the isolation layers 315 and the active regions A are formed, and the first conductive layers 305 over the tunnel insulating layers 303 are patterned in a number of floating gates. In this case, defects may be generated on the sidewalls of the first and second conductive layers 303, 305. In order to correct this problem, a process of oxidizing the sidewalls of the first and second conductive layers 303, 305 must be performed.

In the process for oxidizing the sidewalls of the first and second conductive layers 303, 305, the thickness of the edges of the dielectric layer 317 having the stack structure of the insulating layers, including the oxide layers 307a, 307c, can be increased. In order to prevent this problem, before oxidizing the sidewalls of the first and second conductive layers 303, 305, a second anti-oxidation layer 323 is formed on the sidewalls of the oxide layers 307a, 307c included in the dielectric layer 317.

The second anti-oxidation layer 323 preferably is formed by selectively nitrifying only the sidewalls of the dielectric layer 317. In order to selectively nitrify only the sidewalls of the dielectric layer 317, the dielectric layer 317 preferably is nitrified more rapidly than the first and second conductive layers 305, 319 using a selective plasma nitrification processing. To this end, the process of forming the second anti-oxidation layer 323 preferably is performed using a mixed gas comprising (a) a source gas comprising nitrogen-bonded molecules, (b) an inert gas that forms a plasma, and (c) an etch gas that etches the dielectric layer 317 more rapidly than the etch gas etches the first and second conductive layers 305, 319. The mixed gas preferably is identical to that described above with FIG. 4B.

If the selective plasma nitrification processing is performed using the same mixed gas as that described above with reference to FIG. 4B, the second anti-oxidation layer 323 is selectively formed only on the sidewalls of the oxide layers 307a, 307c included in the dielectric layer 317 according to the same principle as that described above with reference to FIGS. 4B, 5A, and 5B. Accordingly, although defects generated on the sidewalls of the first and second conductive layers 305, 319 are removed using a subsequent oxidation process, a phenomenon in which the thickness of the edges of the dielectric layer 317 is increased can be prevented or reduced.

Further, since the second anti-oxidation layer 323 is selectively formed on the sidewalls of the dielectric layer 317, it results in a structure in which the second conductive layer 319 is stacked on not only the dielectric layer 317, but the second anti-oxidation layer 323.

As described above, according to this disclosure, the sidewalls of the insulating layer, from among the conductive layer and the insulating layer, are selectively nitrified, and the anti-oxidation layer is formed on the sidewalls of the insulating layer. Accordingly, in a subsequent oxidation process, an oxide layer having an adequate thickness for removing defects can be formed on the sidewalls of the conductive layer, and the infiltration of molecules (i.e., a cause of oxidation) into the sidewalls of the insulating layer can be prevented. Consequently, a phenomenon in which the thickness of the edges of the insulating layer is increased can be improved.

Furthermore, distributions of the threshold voltages of memory cells can be improved because a phenomenon in which the thickness of the edges of the insulating layer is increased can be prevented or reduced.

What is claimed is:

1. A method of forming gate patterns of a nonvolatile memory device, the method comprising:
    forming stack patterns each comprising an insulating layer that defines sidewalls and a conductive layer stacked over a semiconductor substrate; and
    forming an anti-oxidation layer on the sidewalls of the insulating layer by selectively nitrifying the insulating layer using a mixed gas including an etch gas that selectively breaks bonds of molecules constituting the insulating layer.

2. The method of claim 1, wherein the mixed gas comprises a source gas comprising nitrogen-bonded molecules, and an inert gas that forms a plasma.

3. The method of claim 1, wherein:
    the insulating layer comprises silicon dioxide ($SiO_2$) including Si—O bonds, and the conductive layer comprises polysilicon.

4. The method of claim 1, wherein the etch gas comprises at least one of $C_xF_y$ and $CH_xF_y$.

5. The method of claim 1, comprising forming the anti-oxidation layer by breaking Si—O bonds of the insulating layer comprising silicon dioxide ($SiO_2$) and bonding a nitrogen radical (N*) to Si separated from the Si—O bonds.

6. The method of claim 1, further comprising oxidizing a surface of the conductive layer after forming the anti-oxidation layer.

7. A method of forming gate patterns of a nonvolatile memory device, the method comprising:
    providing a semiconductor substrate comprising isolation regions and active regions;
    forming trenches in the respective isolation regions and forming stack patterns each having a tunnel insulating layer that defines sidewalls and a first conductive layer stacked over each of the active regions; and
    forming a first anti-oxidation layer on the sidewalls of the tunnel insulating layer by selectively nitrifying the tunnel insulating layer using a mixed gas including an etch gas that selectively breaks bonds of molecules constituting the tunnel insulating layer.

8. The method of claim 7, wherein the mixed gas comprises a source gas comprising nitrogen-bonded molecules, and an inert gas that forms a plasma.

9. The method of claim 7, wherein:
    the tunnel insulating layer comprises silicon dioxide ($SiO_2$) including Si—O bonds, and
    the first conductive layer comprises polysilicon.

10. The method of claim 7, wherein the etch gas comprises at least one of $C_xF_y$ and $CH_xF_y$.

11. The method of claim 7, comprising forming the first anti-oxidation layer by breaking Si—O bonds of the tunnel insulating layer comprising silicon dioxide ($SiO_2$) and bonding a nitrogen radical (N*) to Si separated from the Si—O bonds.

12. The method of claim 7, further comprising oxidizing surfaces of the first conductive layer and of the trenches after forming the first anti-oxidation layer.

13. The method of claim 7, comprising, after forming the first anti-oxidation layer:
    forming isolation layers within the respective trenches;
    stacking a dielectric layer and a second conductive layer over the first conductive layer and each of the isolation layers; and
    etching the second conductive layer, the dielectric layer, and the first conductive layer.

14. The method of claim 13, further comprising, after etching the second conductive layer, the dielectric layer and the first conductive layer:
    forming a second anti-oxidation layer on sidewalls of the dielectric layer by more rapidly nitrifying the dielectric layer than the first and second conductive layers.

15. The method of claim 14, comprising forming the second anti-oxidation layer using a mixed gas of (a) a source gas comprising nitrogen-bonded molecules, (b) an inert gas that forms a plasma, and (c) an etch gas that selectively breaks bonds of molecules constituting the dielectric layer.

16. The method of claim 15, wherein:
    the dielectric layer comprises a stacked layer comprising silicon dioxide ($SiO_2$) including Si—O bonds, and
    the second conductive layer comprises polysilicon.

17. The method of claim 15, wherein the etch gas comprises at least one of $C_xF_y$ and $CH_xF_y$.

18. The method of claim 14, comprising forming the second anti-oxidation layer by breaking Si—O bonds of the dielectric layer comprising silicon dioxide ($SiO_2$) and bonding a nitrogen radical ($N^*$) to Si separated from the Si—O bonds.

19. The method of claim 14, further comprising oxidizing a surface of the second conductive layer after forming the second anti-oxidation layer.

* * * * *